US 6,616,525 B1

(12) United States Patent
Giraldo et al.

(10) Patent No.: US 6,616,525 B1
(45) Date of Patent: Sep. 9, 2003

(54) MODULAR FAN SYSTEM

(75) Inventors: Mike D. Giraldo, Dallas, TX (US); Jeffrey T. Haselby, Plano, TX (US); Christopher C. Womack, Dallas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/135,942

(22) Filed: Apr. 29, 2002

(51) Int. Cl.[7] .................................................. H05K 5/00
(52) U.S. Cl. ........................................ 454/184; 361/695
(58) Field of Search ........................... 454/184; 361/688, 361/690, 692, 695

(56) References Cited

U.S. PATENT DOCUMENTS

| | | | | |
|---|---|---|---|---|
| 4,751,872 A | * | 6/1988 | Lawson, Jr. ................ 454/184 |
| 5,471,099 A | * | 11/1995 | Larabell et al. .............. 307/53 |
| 5,707,282 A | * | 1/1998 | Clements et al. ........... 454/184 |
| 5,936,836 A | * | 8/1999 | Scholder ..................... 361/695 |
| 6,343,011 B1 | * | 1/2002 | Yu ............................. 361/695 |
| 6,351,380 B1 | * | 2/2002 | Curlee et al. ............... 361/695 |
| 6,400,568 B1 | * | 6/2002 | Kim et al. .................. 361/697 |
| 6,435,889 B1 | * | 8/2002 | Vinson et al. .............. 439/247 |
| 6,493,225 B2 | * | 12/2002 | Chuang et al. ............. 361/695 |

* cited by examiner

*Primary Examiner*—Derek Boles
(74) *Attorney, Agent, or Firm*—David W. Boyd

(57) ABSTRACT

A computer system uses a modular fan design. Multiple fan modules can be used, and identical fan modules can be used for directing air into and out of the computer system enclosure. Each fan module is hot swappable, and can be replaced quickly without the use of tools or fasteners. Optional mounting features on the fan and the computer enclosure prevent misassembly, and an optional color coding scheme aids in assembly. An optional splitting light pipe directs light from a single status-indicating source to both the front and back of the fan module.

16 Claims, 9 Drawing Sheets

MODULAR FAN SYSTEM

FIELD OF THE INVENTION

The present invention relates generally to computer systems, and more specifically to cooling methods for computer systems.

BACKGROUND OF THE INVENTION

The cooling of internal components is critical to the operation of modern computer systems. The combined goals of increasing computing performance and smaller size drive computer designers to fill computer enclosures more densely with heat-generating components. If heat is not adequately removed from the computer enclosure, the temperature inside the enclosure may rise to levels that degrade the life and reliability of the computer.

Typically, a computer may use one or more fans to force air through the enclosure. The air movement increases the convective heat transfer coefficient between the electronic components and the air, and exhausts the heat efficiently to the surrounding environment.

Modern computers, especially when used as file servers, are often required to operate for extended periods. If a computer system fails or is shut down for maintenance, there may be disruptions in service, or complex measures may be required to avoid disruptions. For example, an additional, or redundant, computer may be required to provide service during the idle periods of the first computer, and a method must be provided for allowing the second computer to intercede when the first computer is idled. To avoid the complex measures and the cost of additional computers, it is desirable to build computer systems that require a minimum of down time. Ideally, some components may be repaired or replaced without shutting down the computer at all. Such components are often called "hot swappable" components.

The fan or fans in a computer system may be hot swappable, but in some systems, the attachment the fan to the computer system enclosure may utilize screws, wing nuts, bolts, thumb screws, or other hardware fasteners. The fasteners may add to the complexity and time required for servicing the computer system. They may also add to the complexity and cost of manufacturing the computer, both in the assembly process and in the process of maintaining parts inventories and supplier contacts. Often, the fasteners require that tools be used for replacing the fan or fans.

A computer system may employ fans on more than one side of the computer system enclosure. The fans may be configured so that one fan directs air into the enclosure and another fan on another side of the enclosure directs air out of the enclosure. In this way, both fans contribute to the motion of air through the enclosure. In some computer systems, a different fan design may be used in different locations on the enclosure. Using more than one fan design adds to the cost and complexity of the computer system and to the cost and complexity of maintaining the computer system.

In addition, the attachment for the fan or fans may be designed in such a way that it is possible to mount a fan incorrectly. This may result in a fan directing air in the wrong direction or even countering the effect of other fans, thus reducing the cooling effectiveness in the computer system.

If a computer system fan fails, the failure may not be immediately obvious, especially when a computer system uses multiple fans or when multiple computer systems are in close proximity. In the absence of an indication of the failure of a fan, the fan failure may go undetected, compromising the reliability of the computer system.

There is a need for a computer system fan arrangement that provides effective cooling with a minimum number of unique parts, that can be serviced quickly and effectively without tools and with little chance of error, and that can provide a signal when a fan fails.

SUMMARY OF THE INVENTION

A computer system uses a modular fan design. Multiple fan modules can be used, and identical fan modules can be used for directing air into and out of the computer system enclosure. Each fan module is hot swappable, and can be replaced quickly without the use of tools or fasteners. Optional mounting features on the fan and the computer enclosure prevent misassembly, and an optional color coding scheme aids in assembly. An optional splitting light pipe directs light from a single status-indicating source to both the front and back of the fan module.

DETAILED DESCRIPTION OF THE PREFERRED EMBODIMENT

Figure 1:
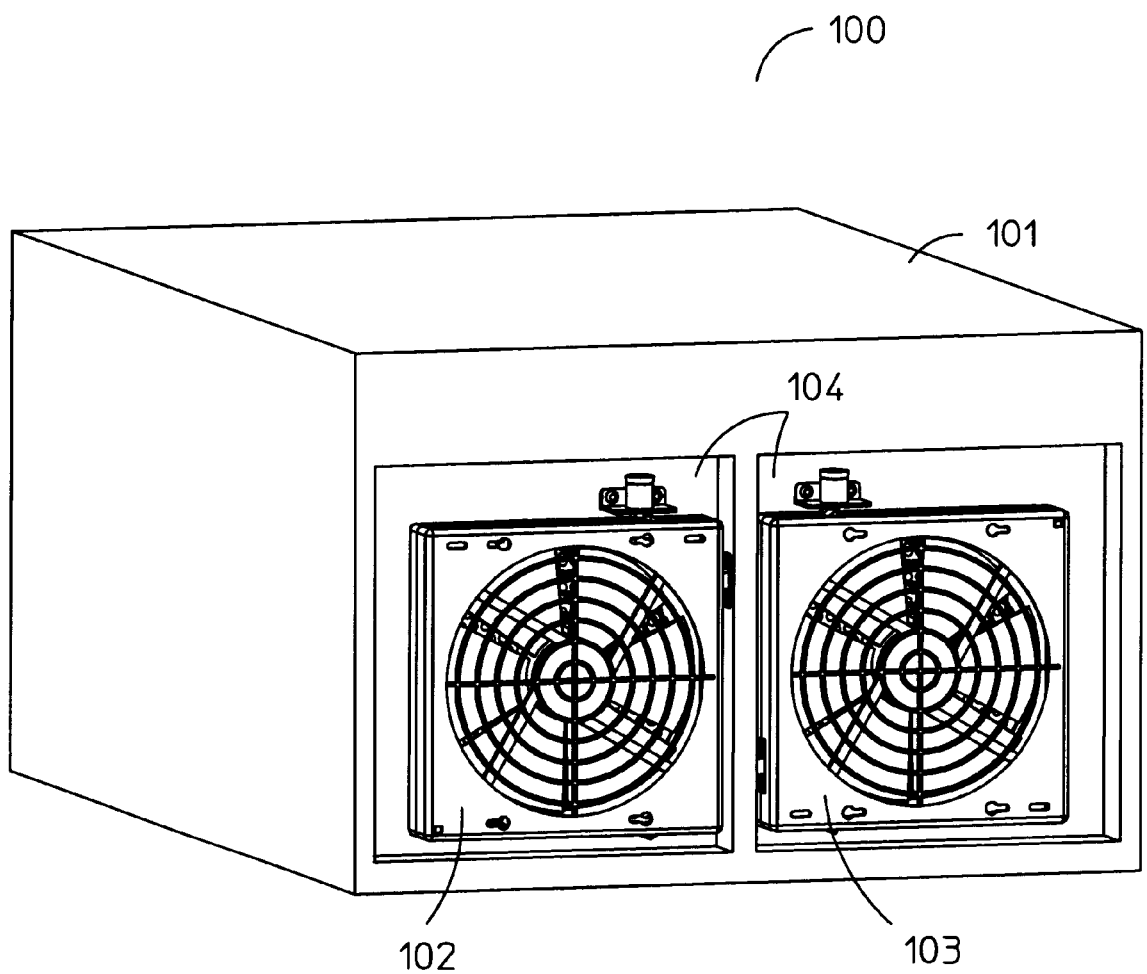
FIG. 1 shows a front perspective view of an example embodiment of a computer system with a modular fan assembly.

FIG. 1 shows a front perspective view of an example embodiment of a computer system 100. The computer system 100 is enclosed by enclosure 101, but no decorative outer shell is shown. Two example embodiment modular fan assemblies 102, 103 are installed on an outer wall 104 of the computer system enclosure 101.

Figure 2:
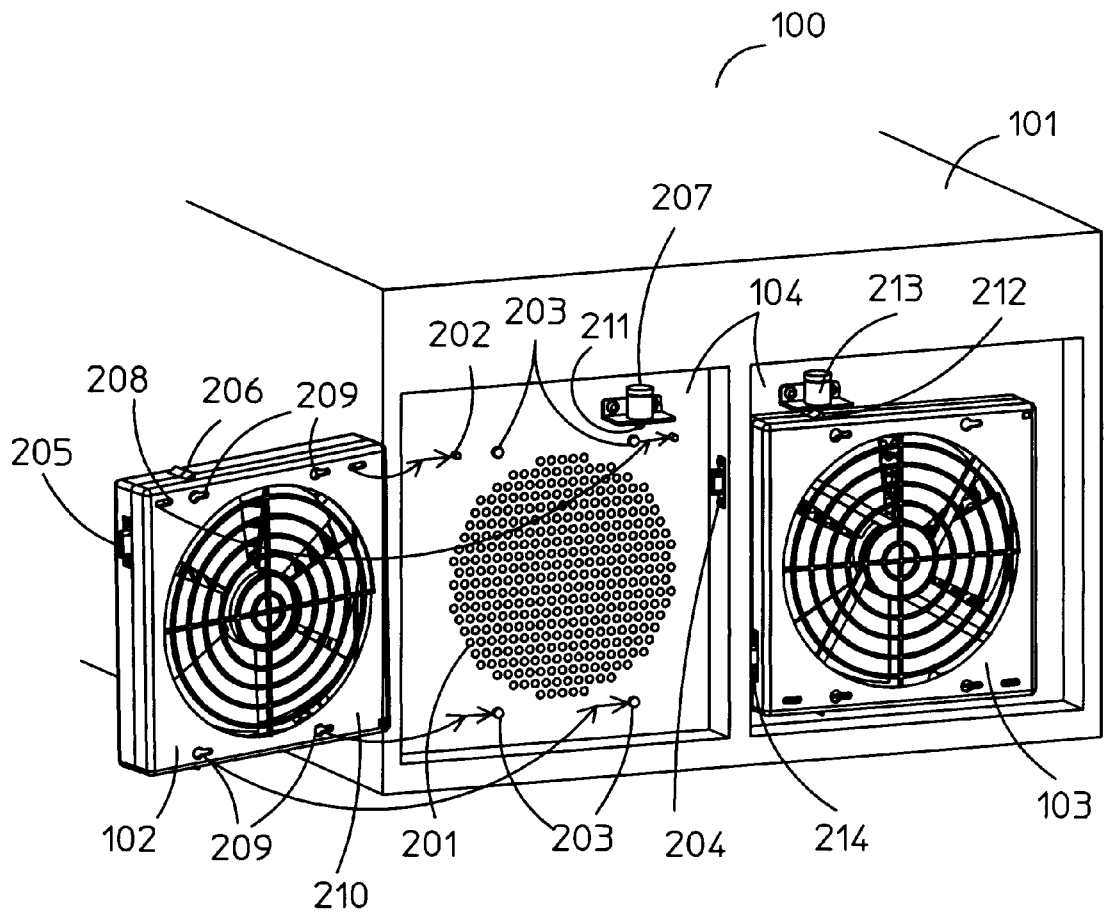
FIG. 2 shows a partial front perspective view of the example computer system of FIG. 1 with a modular fan assembly removed.

FIG. 2 shows a partial front perspective view of example computer system 100 with modular fan assembly 102 removed. Outer wall 104 of enclosure 101 is perforated to allow airflow into or out of the enclosure 101. Hole pattern 201 allows airflow caused by modular fan assembly 102. Attached to outer wall 104 are guiding features 202. During assembly, guiding features 202 engage guide slots 208 in modular fan assembly 102 and aid in positioning modular fan assembly 102. Also attached to outer wall 104 are constraining features 203 that engage openings 209 in modular fan assembly 102. These features are shown in more detail in FIGS. 2a and 3a.

A wall attached to outer wall 104 holds a connector 204 for supplying power and control information to modular fan assembly 102. Modular fan assembly 102 has a mating connector 205 that connects with connector 204 when the modular fan assembly 102 is installed in the computer system 100. Affixed to outer wall 104 is a locking feature 207. Locking feature 207 comprises a spring loaded plunger pin 211 that engages detent feature 206 on modular fan assembly 102, thereby holding modular fan assembly 102 in place. Other embodiments may include other kinds of locking features, such as a spring-loaded lever, pushbutton, or other device.

Figure 5:
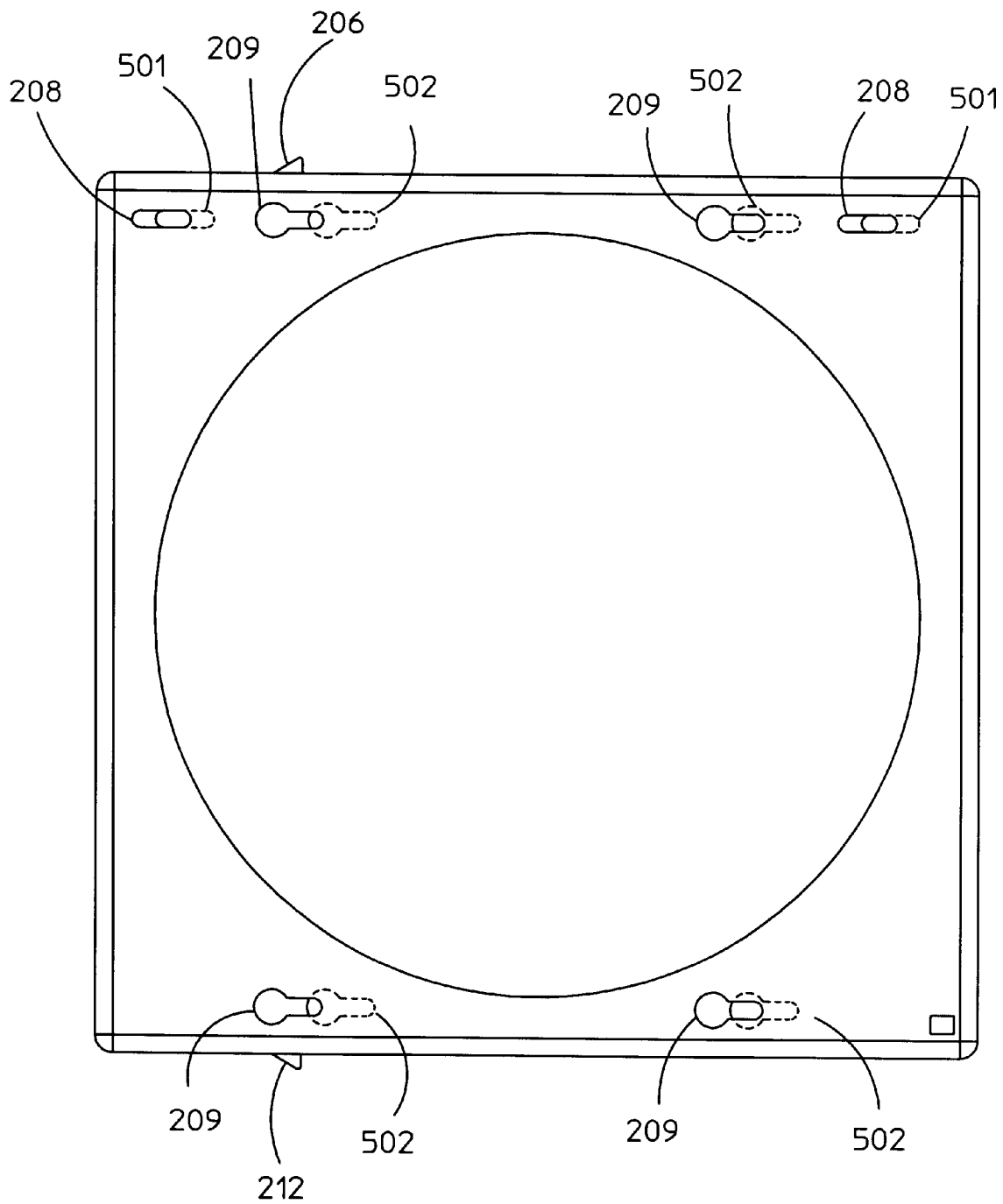
FIG. 5 shows a plan view of the outer shell pieces of an example modular fan assembly, using dashed lines to depict hidden edges.

To install modular fan assembly 102 on outer wall 104, modular fan assembly 102 is placed against outer wall 104 such that guiding features 202 protrude into guiding slots 208, and constraining features 203 protrude through openings 209 in the outer shell 210 of modular fan assembly 102. Modular fan assembly 102 is then slid toward connector 204. During the sliding, guiding features 202 and constraining features 203 serve to constrain the motion of modular fan assembly 102 to a single degree of freedom. Constraining features 203 engage openings 209 in outer shell 210, constraining modular fan assembly 102 against outer wall 104. This engagement is shown in more detail in FIG. 3a. Mating connector 205 is engaged with connector 204 as a result of the sliding motion. The sloped surface of detent feature 206 engages locking feature 207, forcing spring loaded plunger pin 211 to retract until detent feature 206 has passed spring loaded plunger pin 211, at which time spring loaded plunger pin 211 extends to lock modular fan assembly 102 in position. A profile view of detent features 206 and 212 is shown in FIG. 5.

Referring again to FIG. 2, modular fan assembly 103 is installed on outer wall 104 in a similar manner. Modular fan assembly 103 is a substantially identical copy of modular fan assembly 102, but is simply installed in a different orientation, as defined by a pattern of guiding and restraining features similar to those guiding and constraining modular fan assembly 102. A second detent feature 212 is provided on the modular fan assemblies so that a second locking feature 213 may be engaged when modular fan assembly 103 is installed in its orientation. A second connector 214 is provided on enclosure 101 for engaging the connector on modular fan assembly 103.

Figure 2A:
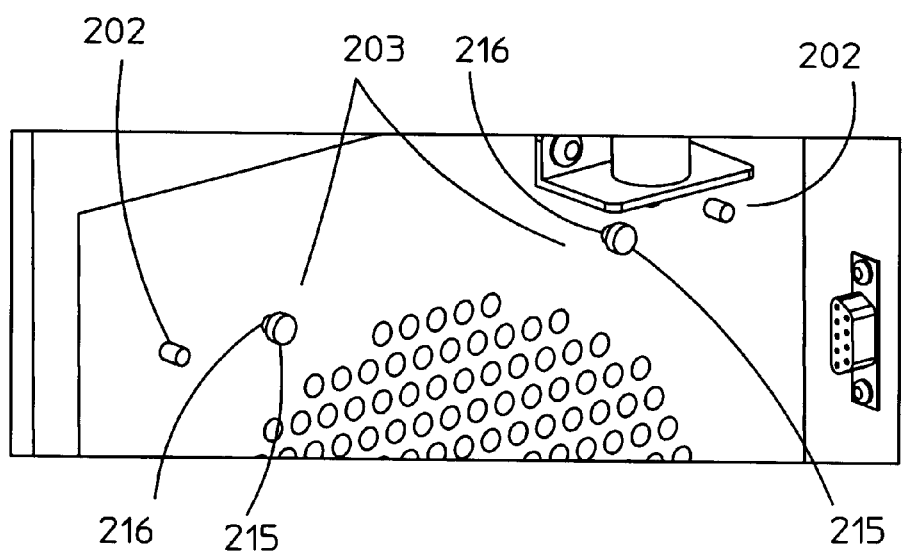
FIG. 2*a* shows guiding features and constraining features on the example computer system of FIG. 2 in greater detail.

FIG. 2a shows guiding features 202 and constraining features 203 in greater detail. Each of guiding features 202 may comprise a cylindrical pin attached to outer wall 104, although a variety of other shapes would function as well. The outer end of each guiding feature 202 may be chamfered, rounded, or have some other shape that facilitates its engagement with one of guiding slots 208 in modular fan assembly 102. Each of constraining features 203 may have a larger cylindrical portion 215 suspended at a distance from outer wall 104 by a smaller cylindrical portion 216. The distance between larger cylindrical portion 215 and outer wall 104 may be slightly more than the thickness of outer shell 210 of modular fan assembly 102. Constraining features 203 may have other shapes that constrain modular fan assembly 102 against outer wall 104 in a similar manner.

Figure 3:
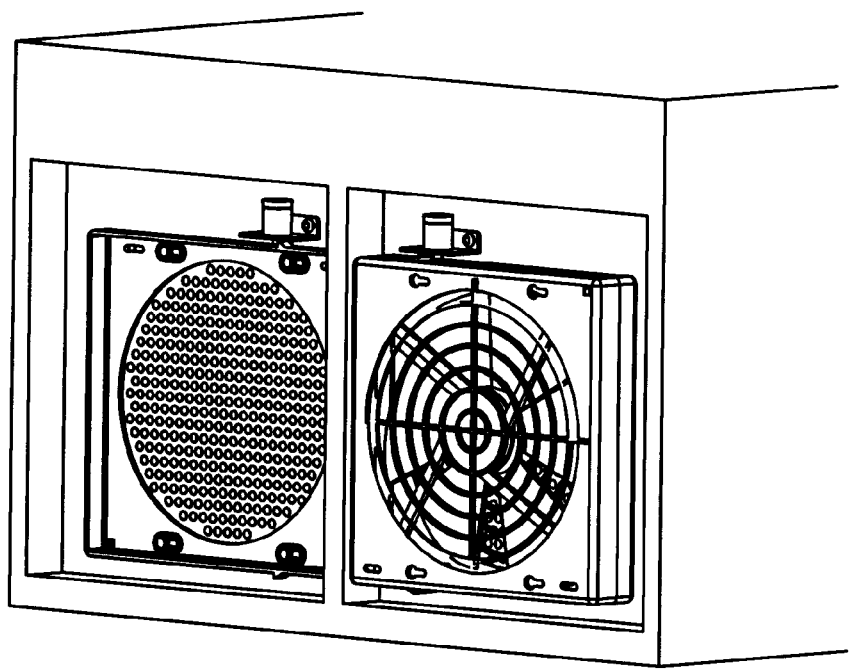
FIG. 3 depicts a cutaway view of a modular fan assembly of FIG. 1 installed on an outer wall of a computer system enclosure.
Figure 3A:
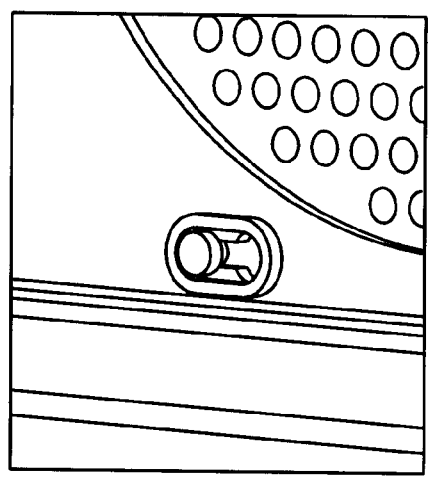
FIG. 3*a* depicts a detail view of a constraining feature and its interaction with an outer shell of the modular fan assembly of FIG. 3.

FIG. 3 depicts a cutaway view of modular fan assembly 102 installed on outer wall 104. Only the portion of the outer shell 210 of modular fan assembly 102 that is disposed against outer wall 104 is shown. FIG. 3a depicts one of constraining features 203 and its interaction with outer shell 210 of modular fan assembly 102, showing how modular fan assembly 102 is constrained against outer wall 104.

The installation of the modular fan assemblies onto enclosure 101 may be accomplished without the aid of tools. Because features built into enclosure 101 constrain and lock the modular fan assemblies in place, no additional fastening hardware is required. The modular fan assemblies snap into place easily.

The modular fan assemblies may also be removed without the use of tools, allowing their replacement quickly and efficiently. The removal process is generally the reverse of the installation process. Using modular fan assembly 102 as an example, spring loaded plunger pin 211 may be disengaged from detent feature 206 by lifting it up with fingers. Modular fan assembly 102 is then slid away from connector 204, until constraining features 203 can pass through openings 209. Modular fan assembly 102 is then lifted away from outer wall 104.

The modular fan assemblies may be removed and replaced while computer system 100 remains in operation. That is, the modular fan assemblies are hot swappable.

Figure 4:
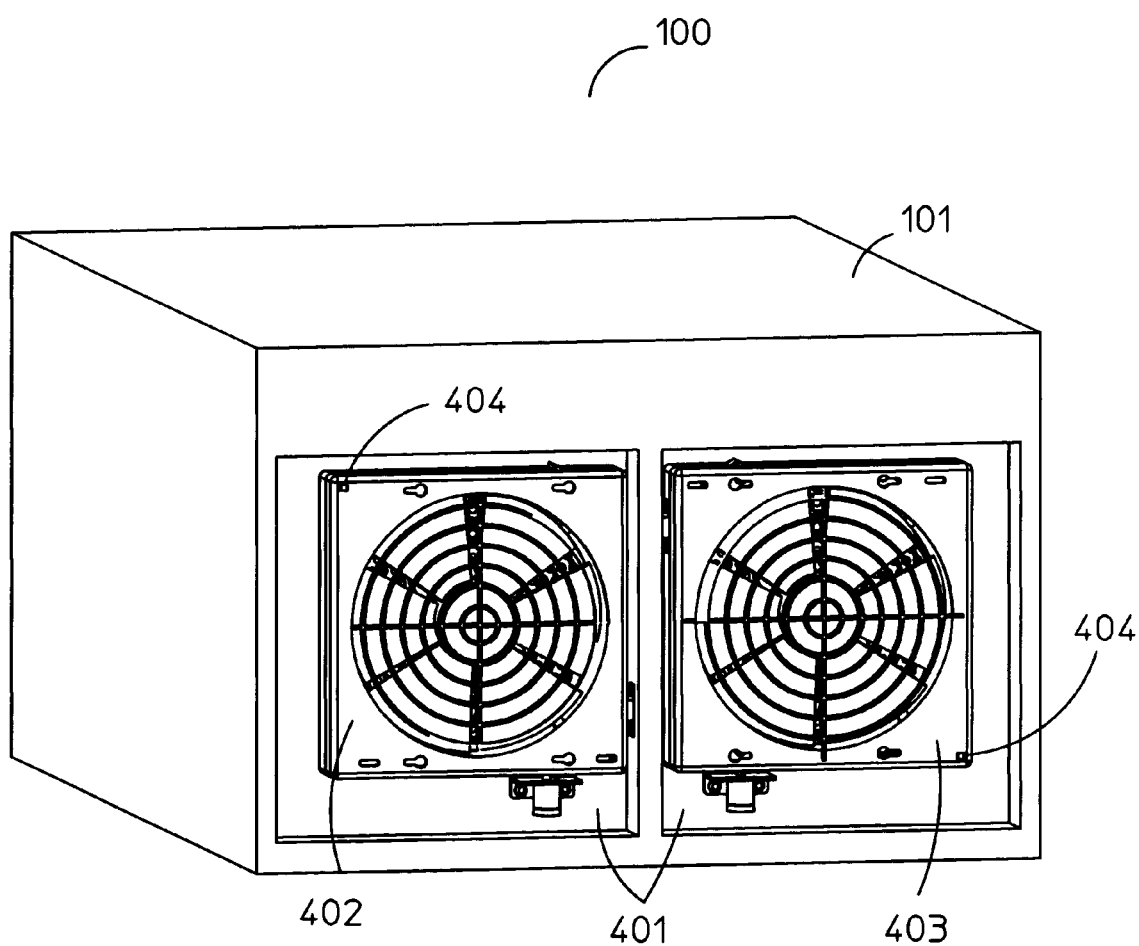
FIG. 4 depicts a rear perspective view of the example computer system of FIG. 1 with modular fan assemblies installed.

FIG. 4 depicts a rear perspective view of computer system 100, showing two additional example embodiment modular fan assemblies 402 and 403 installed on a second outer wall 401 of enclosure 101. Modular fan assemblies 402 and 403 are substantially identical copies of modular fan assemblies 102 and 103, but are simply installed in different orientations. The modular fan assemblies 402 and 403 installed on outer wall 401 direct air in the same direction as modular fan assemblies 102 and 103, thus aiding modular fan assemblies 102 and 103 in causing air to flow through computer system 100. For example, modular fan assemblies 102 and 103 may direct air into computer system enclosure 101 and modular fan assemblies 402 and 403 direct air out of enclosure 101. Or modular fan assemblies 102 and 103 may direct air out of computer system enclosure 101 and modular fan assemblies 402 and 403 direct air into enclosure 101.

Guiding features and constraining features are attached to outer wall 401, but in a different pattern from those on outer wall 104. When a modular fan assembly is constrained against outer wall 104, one outer surface of the modular fan assembly is disposed against outer wall 104 and the opposite outer surface of the modular fan assembly is exposed. When a substantially identical modular fan assembly is constrained against outer wall 401, the disposition of the outer surfaces of the modular fan assembly is reversed. That is, the wall that would be disposed against outer wall 104 is exposed when the modular fan assembly is installed on outer wall 401. The patterns of guiding slots and openings on the two outer surfaces of the modular fan assembly are different, such that a surface of the modular fan assembly that can be disposed against computer system enclosure outer wall 104 cannot be disposed against computer system enclosure outer wall 401 due to the interference of the modular fan assembly outer surface with the guiding and constraining features on outer wall 401. This arrangement ensures that each modular fan assembly can be installed only in the correct orientation to assist the other modular fan assemblies in expediting airflow through computer system 100.

FIG. 5 shows a plan view of the outer shell pieces of modular fan assembly 102 with some hidden lines shown as dashed. This view allows comparison of the patterns of guiding slots and openings in the two outer surfaces of the modular fan assembly. The guiding slots 208 and openings 209 on the near side are shown in solid lines, and the guiding slots 501 and openings 502 on the far side are shown in dashed lines. The two patterns are offset, indicating that the modular fan assembly cannot be installed incorrectly.

Additionally, the front and back sides of the modular fan assembly may optionally be of different colors. Two halves of a "clamshell" fan body may be molded of different colored materials, or the two sides of the modular fan assembly may be painted different colors, or some other method may be used to provide different colors on the two sides of the modular fan assembly. For example, one side may be black and one side may be gray, although any two distinguishable colors will suffice. The pattern of guide slots and openings in the black side of modular fan assembly 102 may match the pattern of guiding and constraining features attached to computer system enclosure outer wall 104, and the pattern of guide slots and openings in the gray side of modular fan assembly 102 may match the different pattern of guiding and constraining features attached to computer system enclosure outer wall 401. Thus modular fan assembly 102 could only be installed with its black side against outer wall 104, or with its gray side against outer wall 401. This color coding gives a computer service technician or other person replacing the modular fan assembly a visual cue as to how to install it, thus making the replacement process simple and efficient. Because fans may usually be replaced one at a time, the process of positioning the modular fan assembly is facilitated by orienting an assembly so that its exposed side is the same color as the exposed side of the modular fan assembly next to it.

The computer system 100 may also comprise circuitry or other means for detecting and indicating failure of the fan in a modular fan assembly. For example, a mechanical detector could be actuated by airflow lack of airflow caused by the fan. The detector may be integrated into each modular fan assembly, or may be inside the computer system. Detecting and indicating a failure of a fan may be especially helpful in an installation with multiple computer systems, where the sound and airflow generated by other computers may make the detection of a fan failure in a particular computer difficult without some failure indication.

A fan failure indicator 404 is depicted in FIG. 4. In the example embodiment, each modular fan assembly has light for indicating a fan failure.

Figure 6:
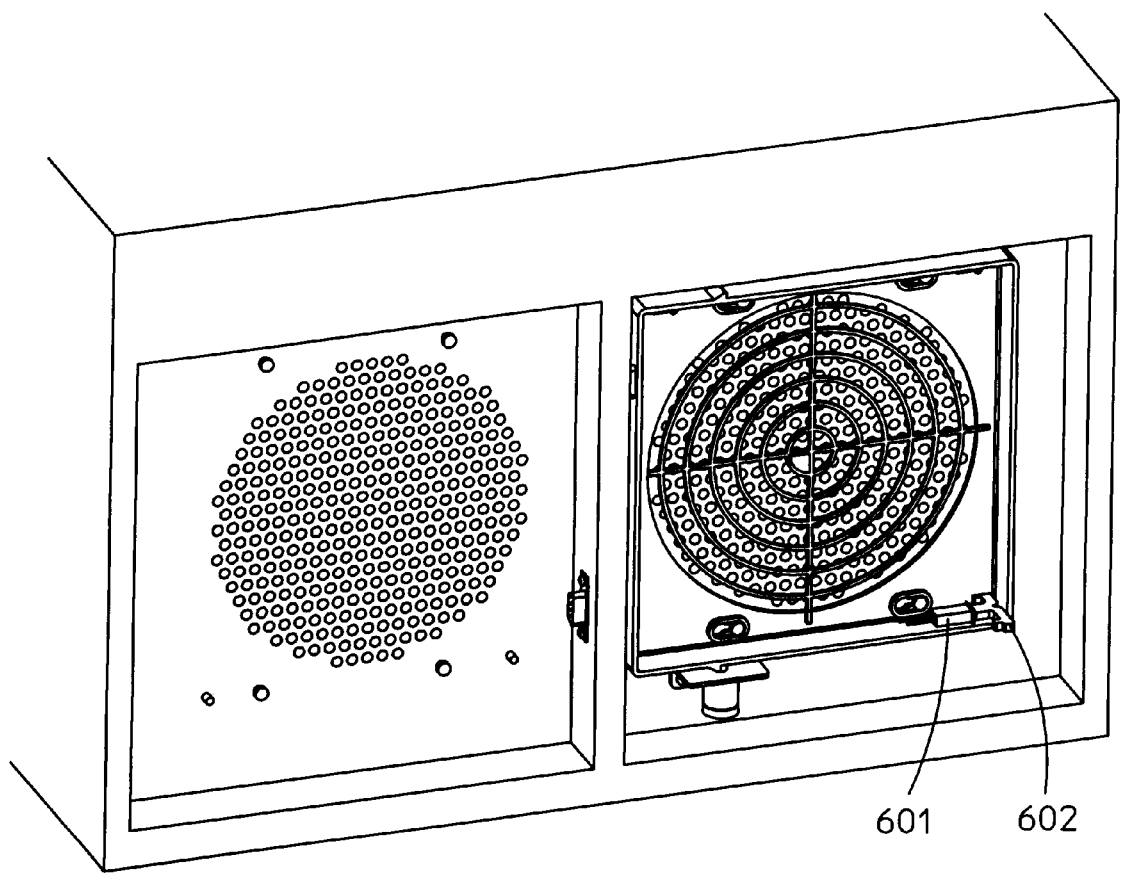
FIG. 6 depicts an example embodiment of an optional failure indicator light.

FIG. 6 depicts an example implementation of a failure indicator using a failure indicator light. Part of the modular fan assembly has been removed in the figure to reveal the example indicator light implementation. When circuitry in the modular fan assembly or elsewhere in the computer detects a fan failure, a signal is sent to light emitting diode (LED) 601. The wiring leading to LED 601 has been omitted from the figure for clarity. LED 601 then emits a visual signal that indicates a fan failure. For example, LED 601 may turn on, emitting light to indicate a failure, or may change the color of the illumination it emits. For example, a two-color LED may be used. The two-color LED may emit green light when the fan is operating properly, and may emit red light when the fan fails. Of course, other colors may be used.

Because each modular fan assembly may be installed on either the front outer wall 104 or the rear outer wall 401 of the computer system enclosure 101, either the front or back side of the modular fan assembly may be visible to a repair technician. In the example embodiment, the light from LED 601 is channeled by a splitting light pipe 602 so that it is visible from either side of the modular fan assembly. The splitting light pipe channels light from the LED principally by internal reflection within the light pipe material.

Figure 7:
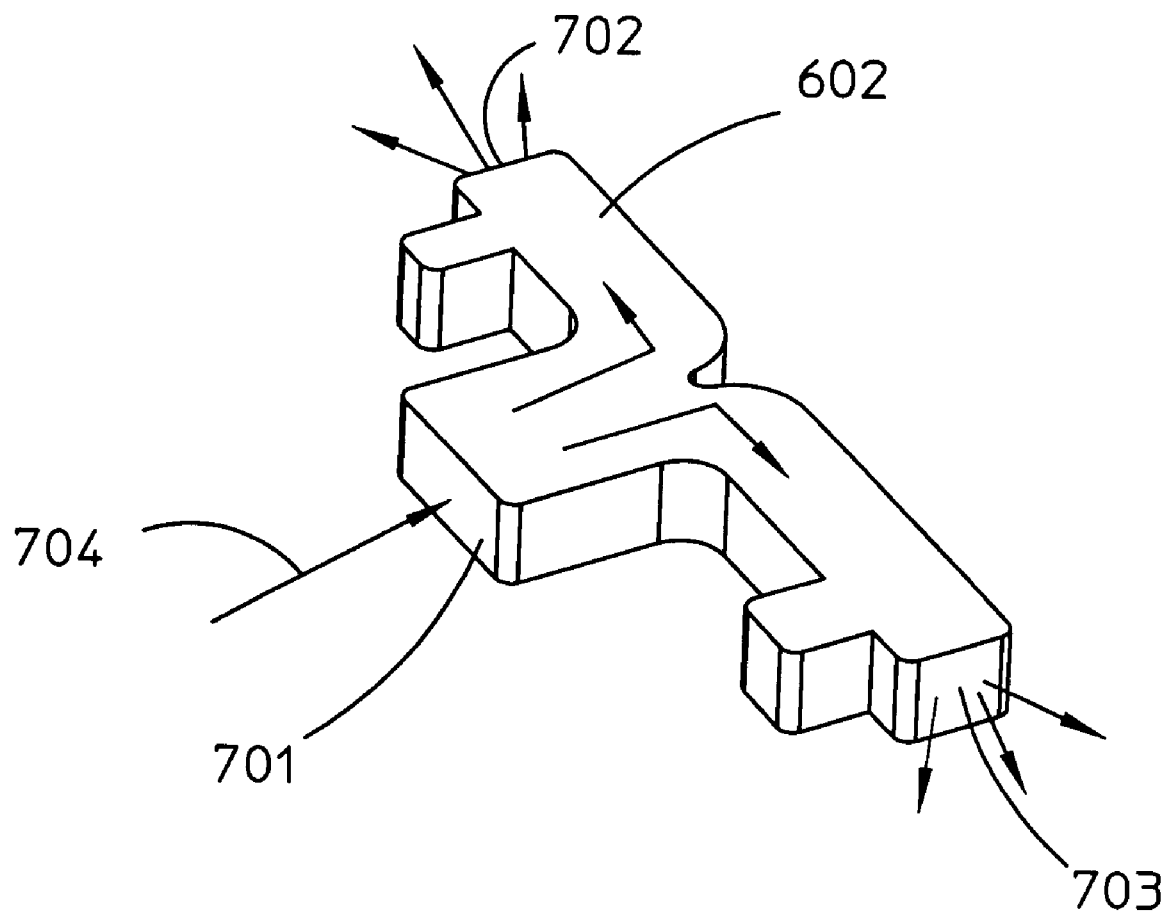
FIG. 7 is a detail view of an example splitting light pipe.

Splitting light pipe 602 is depicted in greater detail in FIG. 7. Light, represented by ray 704, is accepted by splitting light pipe 602 at face 701, and is channeled as shown so that light is emitted from splitting light pipe 602 faces 702 and 703. In this way, a fan failure indication is visible regardless of whether a modular fan assembly is installed on the front or rear outer wall of computer system enclosure 101.

Figure 8:
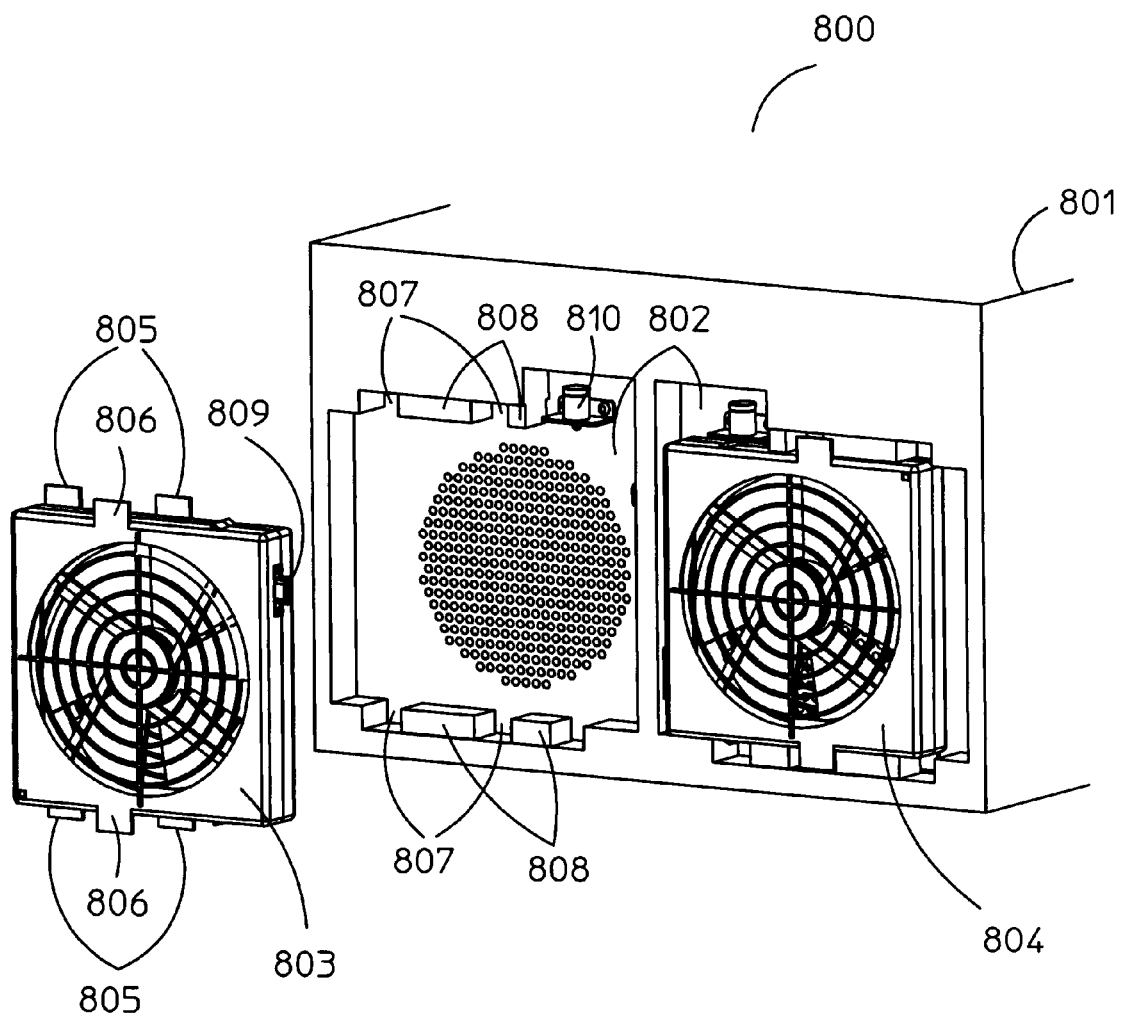
FIG. 8 depicts a partial front perspective view of an alternative embodiment of a computer system with a modular fan assembly.

FIG. 8 depicts a partial front perspective view of an alternative embodiment of a computer system with a modular fan assembly. In this second example embodiment, computer system 800 has an enclosure 801 having an outer wall 802. Modular fan assembly 803 may be installed on outer wall 802. A second modular fan assembly 804, substantially identical to modular fan assembly 803 may also be installed on outer wall 802.

Modular fan assembly 803 has tabs 805 formed into one of its sides, and tabs 806 formed into the other side. During installation, tabs 805 are placed into openings 807, which are adjacent to constraining features 808, until modular fan assembly 803 is against outer wall 802. Constraining features 808 serve to align modular fan assembly 803 correctly. When modular fan assembly 803 is against outer wall 802, modular fan assembly 803 is slid in the direction of its connector 809, until connector 809 engages a mating connector attached to enclosure 801. At approximately the same time, a locking 810 feature on enclosure 801 engages a detent feature 811 on modular fan assembly 803, locking modular fan assembly 803 in place. As a result of the sliding motion, tabs 805 pass between constraining features 808 and outer wall 802, thus holding modular fan assembly 803 against outer wall 802. If an attempt is made to install modular fan assembly in an incorrect orientation, tabs 805 or 806 will interfere with constraining features 808, making the incorrect installation impossible.

Modular fan assembly 804 may be installed similarly. A similar pattern of constraining features ensures that modular fan assembly 805 may be installed only it its correct orientation.

Figure 9:
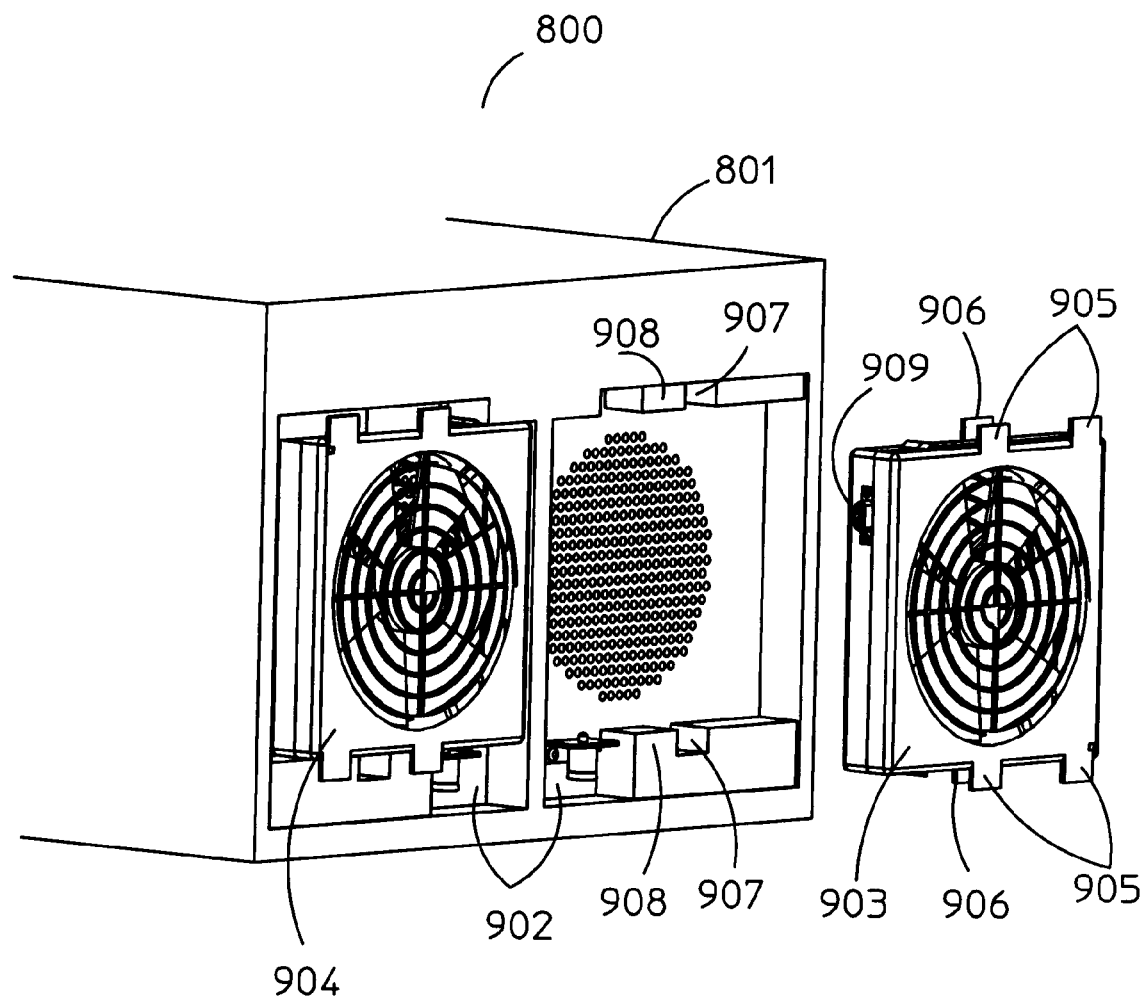
FIG. 9 shows a partial rear perspective view of the example computer system of FIG. 8.

FIG. 9 shows a partial rear perspective view of the example computer system of FIG. 8. Modular fan assembly 903 may be installed on enclosure outer wall 902 in a manner similar to how modular fan assembly 803 was installed on outer wall 802. Constraining features 908 with openings 907 accept tabs 906 on modular fan assembly 903, and guide modular fan assembly 903 into place. Tabs 906 pass behind constraining features 908, constraining modular fan assembly 903 against outer wall 902. A detent feature engages a locking feature to lock modular fan assembly 903 in place.

Constraining features 908 serve to guarantee that the correct surface of modular fan assembly 903 is constrained against outer wall 902, and that modular fan assembly 903 cannot be installed incorrectly. Modular fan assembly 904 may be installed in a similar manner.

The foregoing description of the present invention has been presented for purposes of illustration and description. It is not intended to be exhaustive or to limit the invention to the precise form disclosed, and other modifications and variations may be possible in light of the above teachings. For example, LED 601 could emit light when the fan is operational, and switch off when the fan fails, rather than the reverse. Or for example, other configurations could be envisioned that ensure that a modular fan assembly cannot be installed incorrectly. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A computer system, comprising:
   a) a computer enclosure comprising a first outer wall;
   b) a first set of constraining features disposed on the computer enclosure;
   c) a first modular fan assembly comprising an outer shell having a front side, the first set of constraining features engaging features on the outer shell of the first modular fan assembly and constraining the front side of the first modular fan assembly against the first outer wall of the computer system enclosure, and wherein the first modular fan assembly is configured to allow attachment to the computer system only in its correct orientation, and is configured to allow installation and removal without the use of tools;
   d) a second outer wall of the computer enclosure;
   e) a second set of constraining features disposed on the computer enclosure;
   f) a second modular fan assembly substantially identical to the first;
   g) an outer shell of the second modular fan assembly, having a front side and a back side, the second set of constraining features engaging features on the back side of the second modular fan assembly and constraining the modular fan assembly against the second outer wall of the computer system enclosure; and
   wherein the features in the front side of a modular fan assembly are configured to engage only the first set of constraining features on the computer enclosure, and the features in the back side of a modular fan assembly are configured to engage only the second set of constraining features on the computer enclosure.

2. A computer system, comprising:
   a) a computer enclosure comprising a first outer wall;
   b) a first set of constraining features disposed on the computer enclosure;
   c) a first modular fan assembly comprising an outer shell having a front side, the first set of constraining features engaging features on the outer shell of the first modular fan assembly and constraining the front side of the first modular fan assembly against the first outer wall of the computer system enclosure, and wherein the first modular fan assembly is configured to allow attachment to the computer system only in its correct orientation, and is configured to allow installation and removal without the use of tools;
   d) a second outer wall of the computer enclosure;
   e) a second set of constraining features disposed on the computer enclosure;
   f) a second modular fan assembly substantially identical to the first;
   g) an outer shell of the second modular fan assembly, having a front side and a back side, the second set of constraining features engaging features on the back side of the second modular fan assembly and constraining the modular fan assembly against the second outer wall of the computer system enclosure; and
   wherein mounting a modular fan assembly on the first outer wall of the enclosure positions the fan such that the fan directs air into the computer enclosure, and wherein mounting a modular fan assembly on the second outer surface of the enclosure positions the fan such that the fan directs are out of the computer enclosure.

3. A computer system, comprising:
   a) a computer enclosure comprising a first outer wall;
   b) a first set of constraining features disposed on the computer enclosure;
   c) a first modular fan assembly comprising an outer shell having a front side, the first set of constraining features engaging features on the outer shell of the first modular fan assembly and constraining the front side of the first modular fan assembly against the first outer wall of the computer system enclosure, and wherein the first modular fan assembly is configured to allow attachment to the computer system only in its correct orientation, and is configured to allow installation and removal without the use of tools;
   d) a second outer wall of the computer enclosure;
   e) a second set of constraining features disposed on the computer enclosure;
   f) a second modular fan assembly substantially identical to the first;
   g) an outer shell of the second modular fan assembly, having a front side and a back side, the second set of constraining features engaging features on the back side of the second modular fan assembly and constraining the modular fan assembly against the second outer wall of the computer system enclosure; and
   wherein the two sides of each modular fan assembly are of different colors.

4. A modular fan assembly, comprising:
   a) an outer shell comprising a front side and a back side substantially opposite the front side;
   b) a first set of features disposed in the front side of the outer shell configured to engage a first set of constraining features on a computer system enclosure; and
   c) a second set of features disposed in the back side of the outer shell configured to engage a second set of constraining features on a computer enclosure, the two sets of features configured such that each can engage only its corresponding pattern of constraining features.

5. The modular fan assembly of claim 4, further comprising a status indicator visible from both sides of the modular fan assembly.

6. The modular fan assembly of claim 5 wherein the status indicator is a light, and further comprising a splitting light pipe configured to accept light from the status-indicating light, the splitting light pipe emitting light from both the front and back sides of the modular fan assembly.

7. The modular fan assembly of claim 4 wherein the front and back sides of the modular fan assembly are of different colors.

8. A method of cooling a computer system comprising the steps of:
   a) attaching a first set of constraining features to an enclosure of the computer system;
   b) attaching a second set of constraining features to the enclosure of the computer system;

c) constructing a first modular fan assembly having an outer shell with two sides, the outer shell having a first set of features, able to engage only the first set of constraining features, disposed on one side and a second set of features, able to engage only the second set of constraining features, on the second side;

d) attaching the first modular fan assembly to a first outer wall of the enclosure of the computer system, engaging the set of features on the first side of the first modular fan assembly with the first set of constraining features on the enclosure of the computer system;

e) constructing a second modular fan assembly substantially identical to the first; and f) attaching the second modular fan assembly to a second outer wall of the enclosure of the computer system, engaging the set of features on the second side of the second modular fan assembly with the set of constraining features on the enclosure of the computer system.

9. The method of claim 8 wherein the first modular fan assembly directs air into the enclosure of the computer system and the second modular fan assembly directs air out of the enclosure of the computer system.

10. A computer system, comprising:

a) means for guiding a modular fan assembly into a proper position;

b) means for ensuring the modular fan assembly is attached only in the proper position;

c) means for constraining the modular fan assembly against an outer wall of an enclosure of the computer system;

d) means for locking the modular fan assembly in place;

e) means for attaching a second modular fan assembly to a second outer wall of the enclosure, the second modular fan assembly being identical to the first;

f) means for ensuring that the first and second modular fan assemblies are attached only in their proper positions; and wherein the first modular fan assembly directs air into the enclosure of the computer system and the second modular fan assembly directs air out of the enclosure of the computer system.

11. A computer system, comprising:

a) a first modular fan assembly;

b) a second modular fan assembly substantially identical to the first; and c) an enclosure, the first and second modular fan assemblies mountable on the enclosure without the use of tools or fasteners, such that the first modular fan assembly directs air into the enclosure, and the second modular fan assembly directs air out of the enclosure.

12. The computer system of claim 11 wherein the modular fan assemblies are hot swappable.

13. The computer system of claim 11 wherein each modular fan assembly comprises two sides, the two sides being of different colors.

14. The computer system of claim 11 wherein each modular fan assembly comprises:

a) two sides; and b) a status indicator visible from both sides.

15. The computer system of claim 14 wherein each modular fan assembly further comprises a splitting light pipe.

16. The computer system of claim 11 wherein each modular fan assembly can be installed only it its correct orientation.

* * * * *